United States Patent [19]

Rao et al.

[11] Patent Number: 4,457,066

[45] Date of Patent: Jul. 3, 1984

[54] METHOD OF MAKING SINGLE-LEVEL POLYSILICON DYNAMIC MEMORY ARRAY

[75] Inventors: G. R. Mohan Rao; Donald J. Redwine, both of Houston, Tex.

[73] Assignee: Texas Instruments Incorporated, Dallas, Tex.

[21] Appl. No.: 197,293

[22] Filed: Oct. 15, 1980

[51] Int. Cl.³ ............................................. H01L 21/28
[52] U.S. Cl. .................................... 29/571; 29/576 B;
29/577 C; 29/591; 148/187
[58] Field of Search .................. 29/571, 577 C, 576 B, 29/591; 148/1.5, 187

[56] References Cited

U.S. PATENT DOCUMENTS

| | | | |
|---|---|---|---|
| 4,055,444 | 10/1977 | Rao | 357/51 X |
| 4,112,575 | 9/1978 | Fu et al. | 148/187 X |
| 4,164,751 | 4/1979 | Tasch et al. | 148/187 X |
| 4,239,559 | 12/1980 | Ito | 148/187 X |
| 4,240,092 | 12/1980 | Kuo | 357/91 X |
| 4,240,845 | 12/1980 | Esch et al. | 148/1.5 X |
| 4,357,747 | 11/1982 | Kurakami et al. | 148/187 X |

*Primary Examiner*—G. Ozaki
*Attorney, Agent, or Firm*—John G. Graham

[57] ABSTRACT

A dynamic read/write memory cell of the one transistor type is made by a single-level polysilicon process in which the word address lines and the bias lines for the capacitors are formed by metal strips. The gates of the access transistors and the capacitor gates are polysilicon. Metal-to-polysilicon contacts are made to connect the metal word lines to the polysilicon gates of the access transistors and to connect the metal bias lines to the capacitor gates.

11 Claims, 10 Drawing Figures

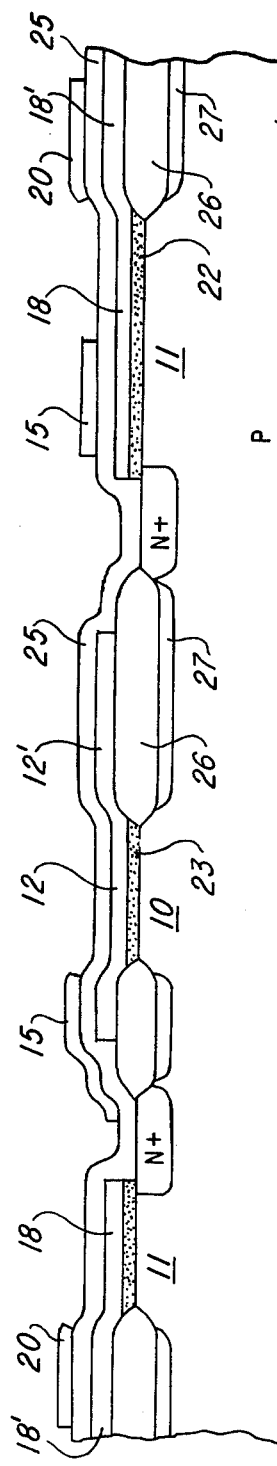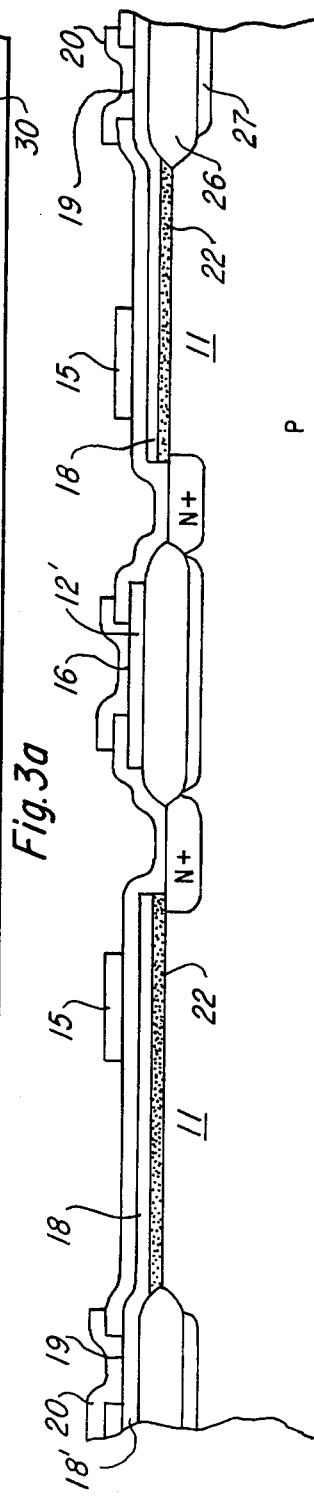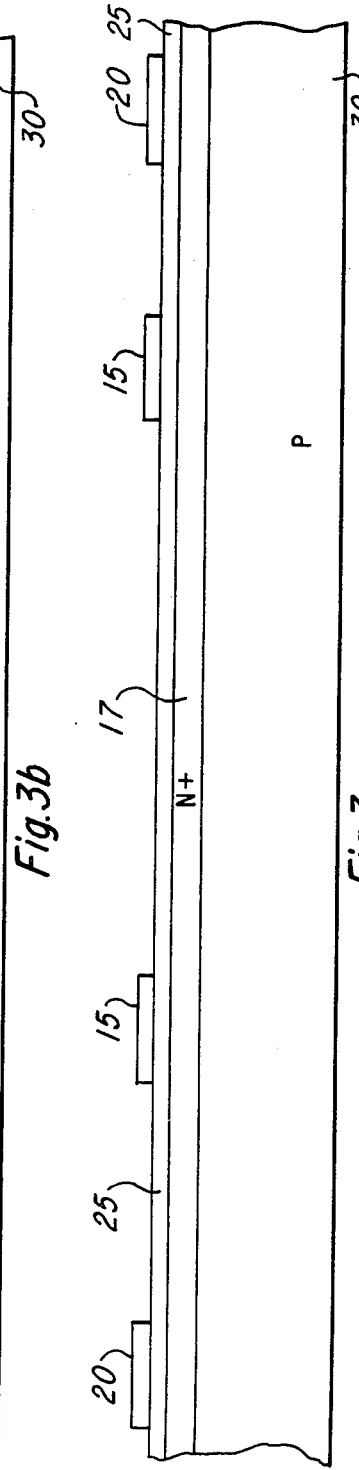

METHOD OF MAKING SINGLE-LEVEL POLYSILICON DYNAMIC MEMORY ARRAY

BACKGROUND OF THE INVENTION

This invention relates to semiconductor memory devices and a method of manufacture, and more particularly of a onetransistor dynamic read/write memory cell array.

Dynamic read/write memory cells made by the doublelevel polysilicon N-channel self-alligned process commonly used in the industry are shown in U.S. Pat. No. 4,240,092, by C-K Kuo, assigned to Texas Instruments, as well as in Electronics, Feb. 19, 1976, pp. 116-121, May 13, 1976, pp. 81-86, and Sept. 28, 1978, pp. 109-116.

Although the double-level polysilicon process has proved to be quite successful and many hundreds of millions of memory devices have been made in this way, there is nevertheless added cost and degradation in yield due to the additional process steps compared to a single level process. Further, the classic cell layout uses a transistor which has a channel length determined by the amount of overlap of the two poly levels, making the characteristics of the transistor difficult to control. Single level polysilicon dynamic RAM cells as seen in U.S. Pat. No. 4,055,444, issued to G. R. Mohan Rao, assigned to Texas Instruments, ordinarily use a continuous polysilicon strip as the capacitor bias line. When attempting to lay out this type of single level poly cell in small cell size with the bit lines close together, problems arise in routing the capacitor bias lines, and the fact that a metal-to-poly contact is needed for each transistor is undesirable.

It is the principal object of this invention to provide an improved dynamic read/write memory cells. Another object is to provide a dynamic memory of more expedient layout and small cell size. An additional object is to provide a dense array of dynamic memory cells, made by a more efficient method. A further object is to provide an improved way of making dynamic memory cells without using double-level polysilicon in the array. Another object is to avoid relying upon features such as polysilicon lines for capacitor bias, and alignment precision in defining transistor channel lengths in dynamic memory cells, and to reduce cost by sharing a contact between two memory cells, thus reduced complexity in wafer fabrication.

SUMMARY OF THE INVENTION

In accordance with an illustrative embodiment of the invention a dynamic read/write memory cell of the one transistor type is made by a single-level polysilicon process in which the word address lines and the bias lines for the capacitors are formed by metal strips. The gates of the access transistors and the capacitor gates are polysilicon. Metal-to-polysilicon contacts are made to connect the metal word lines to the polysilicon gates of the access transistors and to connect the metal bias lines to the capacitor gates.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIGS. 3a-3l are cross-section views of the cells of FIG. 1, taken along the lines a—a, b—b, c—c, d—d and e—e, respectively.

DETAILED DESCRIPTION OF SPECIFIC EMBODIMENT

Figure 1:
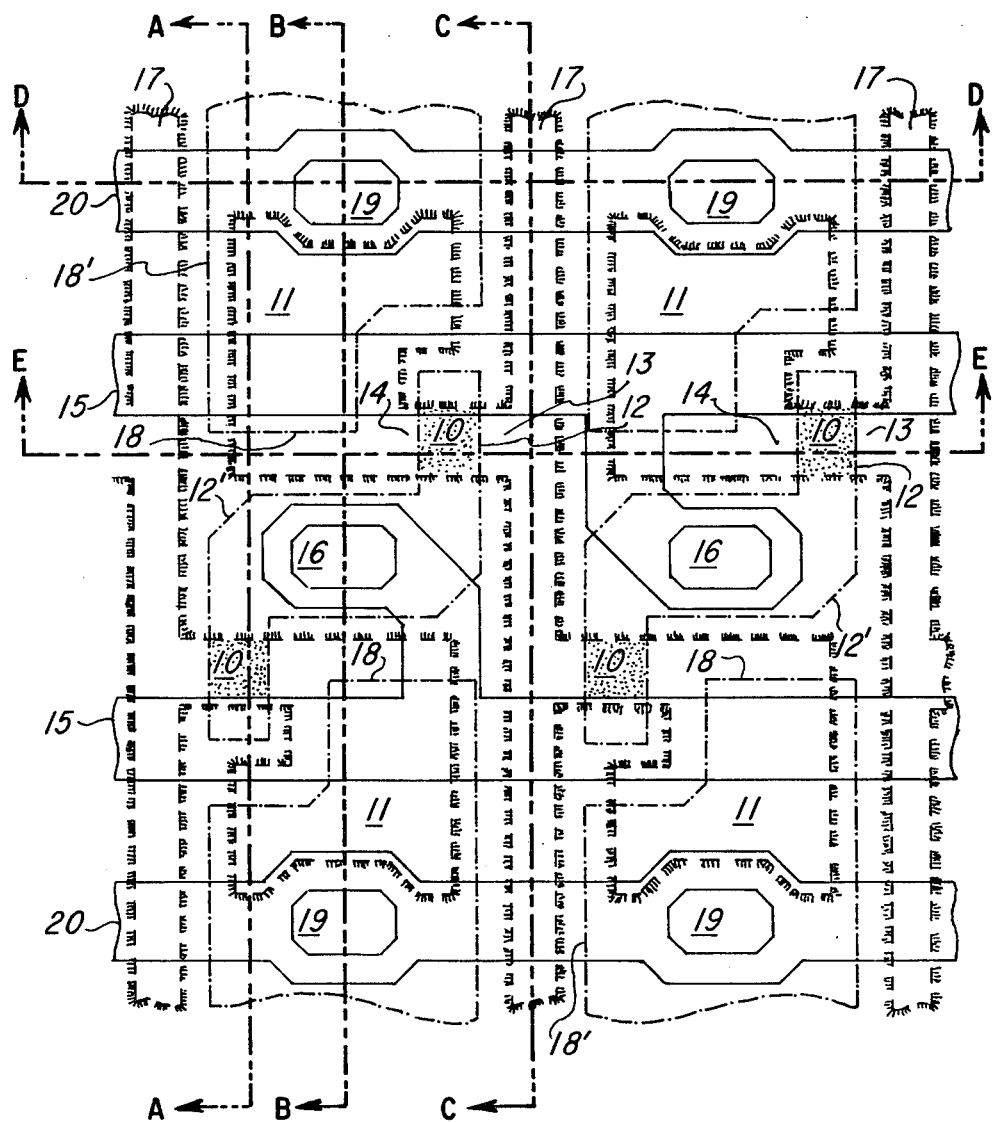
FIG. 1 is a greatly enlarged plan view of a small portion of a semiconductor chip showing the physical layout of a part of a dynamic memory cell array employing cells made according to the invention.
Figure 2:
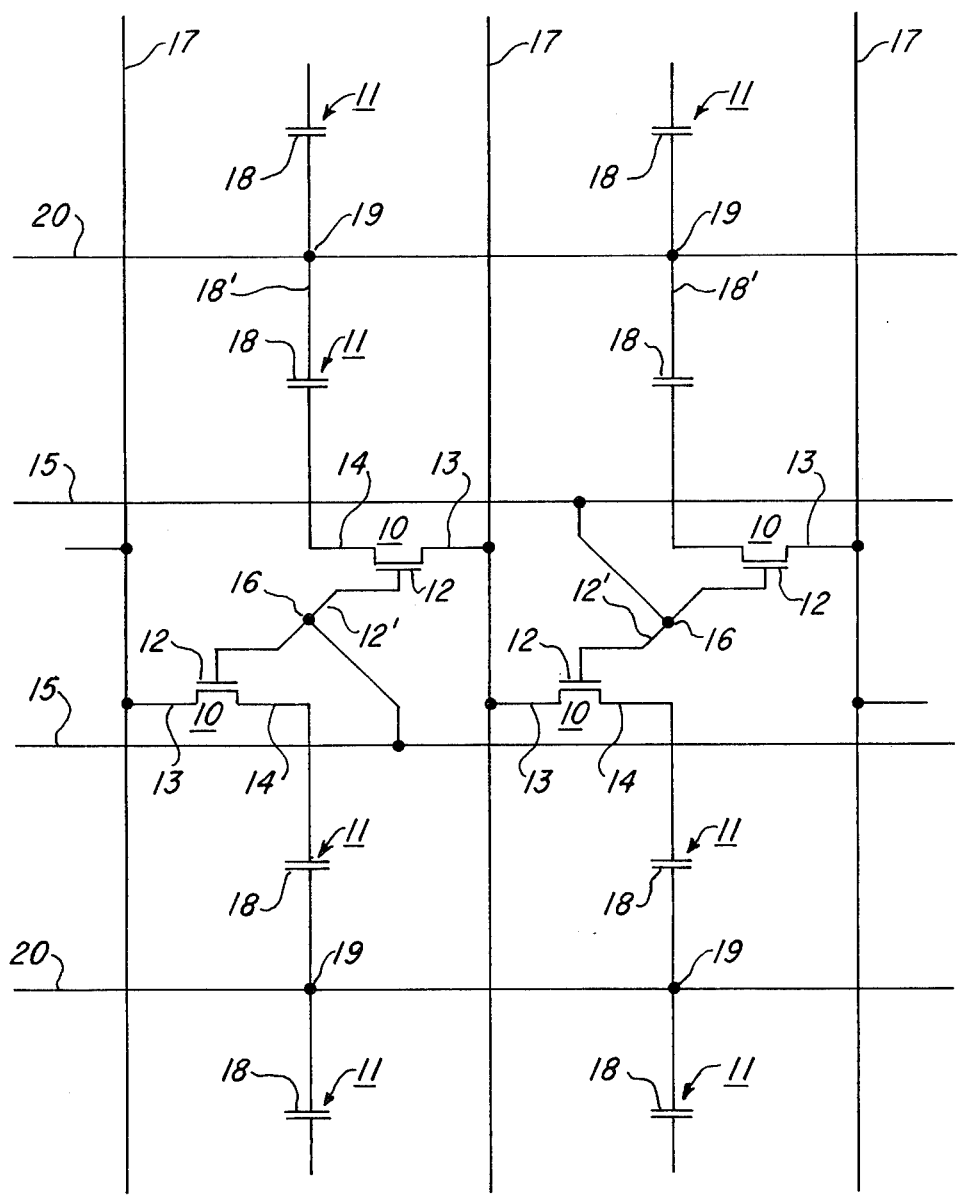
FIG. 2 is an electrical schematic diagram of the part of the cell array of FIG. 1.
Figure 3D:
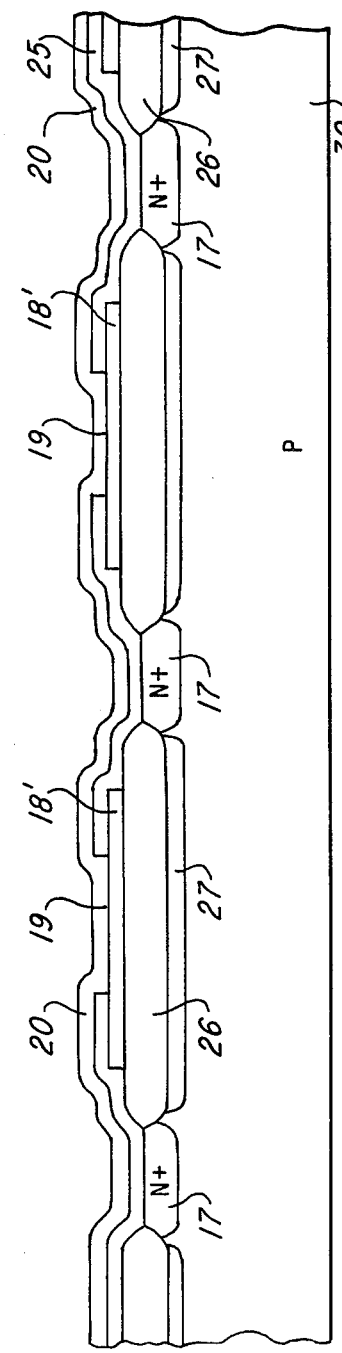
Figure 3E:
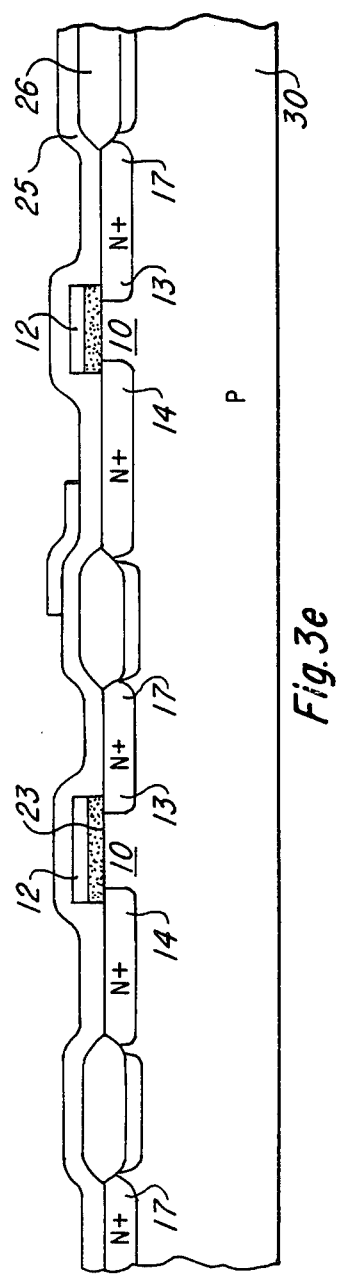

With reference to FIGS. 1, 2, and 3a-3e, a one-transistor dynamic memory cell is illustrated which is made according to the invention. The array consists of a large number of cells, each with an access transistor 10 and a capacitor 11. The access transistor 10 has a gate 12, a source 13 and a drain 14. The gates 12 are first-level polysilicon and connected at contacts 16 to elongated metal strips 15 which are the X or word address lines for the array. The sources 13 are parts of elongated N+ diffused moat regions 17 which are the bit lines or Y output lines. The capacitors 11 include a first level polysilicon bias gate 18 which is connected at a contact 19 to an elongated metal 20 strip extending along the entire array and connected to the Vcc supply, ordinarily +5V. The lower plates of the capacitors 11 are created by inverted regions beneath the gates 18. The metal-to-polysilicon contacts 16 are shared by two adjacent cells, as are the contacts 19; it is noted that these contacts are over field oxide, not thin oxide.

A thin gate oxide layer 22 separates the first level polysilicon bias gate 18 from the silicon surface, and a thin gate oxide layer 23 separates the polysilicon gate 12 from the silicon; another thin thermal oxide coating is formed over the polysilicon 12 and 18 in each cell. A thick layer 25 of low temperature deposited oxide overlies this coating on the upper surface of the bar, beneath the metal strips. A thick thermal field oxide coating 26 covers parts of the bar not occupied by the transistors or diffused interconnects (moat regions), and P+ channel stop regions 27 are formed underneath all the thick field oxide.

The array is formed on a silicon bar 30 which would typically contain perhaps 16K bits on a bar less than 200 mils on a side or about 25,000 mil² area, depending upon the bit density. The cells shown would be on a minute part of the bar perhaps about one or two mils wide. A 16k cell array would require 128 of the metal X address lines 15 and 128 of the N+ diffused Y lines 17, providing 16,384 bits.

Figure 4A:
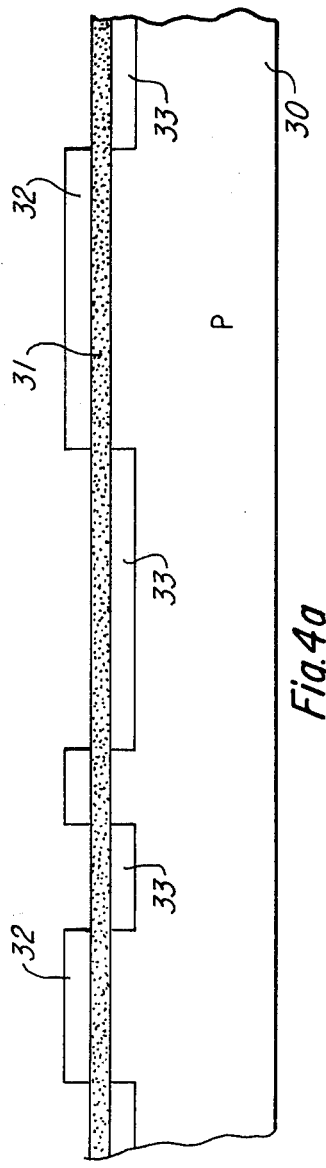
FIGS. 4a-4c are cross-section views of the cell array of FIGS. 1 and 3a-3e, at successive stages in the manufacturing process, taken generally along the line a-a in FIG. 1.
Figure 4B:
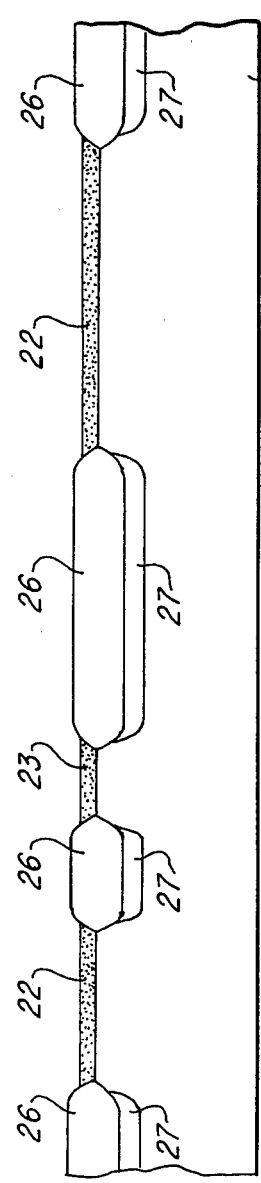
Figure 4C:
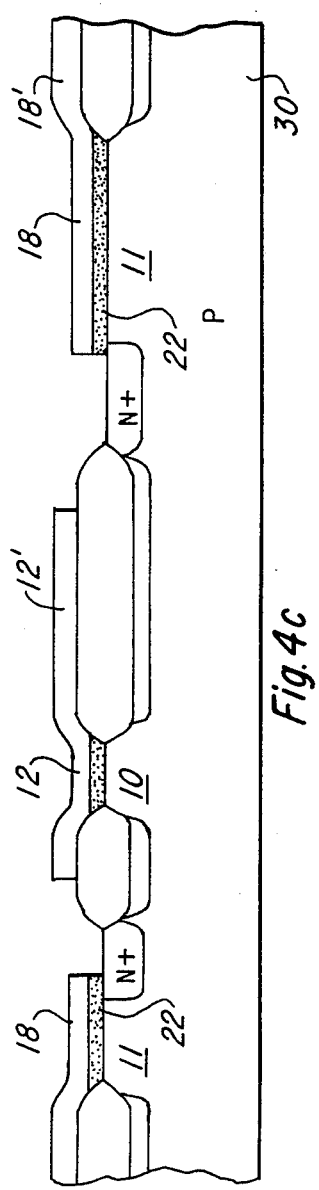

Turning now to FIGS. 4a-4c, a process for making the cell array according to the invention will be described. The starting material is a slice of P type monocrystalline silicon, or P- epitaxial layer on P+ substrate, typically four inches in diameter and twenty mils thick, cut on the <100> plane, of a resistivity of about 10 to 15 ohm-cm. As mentioned above, in the FIGURES the portion shown of the bar 30 represents only a very small part of the slice, perhaps one or two mils wide. After appropriate cleaning, the slice is oxidized by exposing to oxygen in a furnace at an elevated temperature of perhaps 1100° C. to produce an oxide layer 31 over the entire slice of a thickness of about 1000 Å. Next, a layer 32 of silicon nitride of about 1000 Å thickness is formed over the entire slice by exposing to an atmosphere of dichlorosilane and ammonia in a reactor. A coating of photoresist is applied to the entire top surface of the slice, then exposed to ultraviolet light through a mask which defined the desired pattern of the thick field oxide 26 and the P+ channel stops 27. The resist is developed, leaving areas where nitride is then removed by etching the exposed part of the nitride layer 32 but leaving in place the oxide layer 31.

Using photoresist and nitride as a mask, the slice is subjected to a boron implant step to produce the channel stop regions in unmasked regions 33 of silicon. The regions 33 will not exist in the same form in the finished device, because silicon is consumed in the field oxidation procedure. Usually the slice is subjected to a heat treatment after implant, prior to field oxide growth, as set forth in the above mentioned U.S. Pat. No. 4,055,444.

The next step in the process is the formation of field oxide 26 by subjecting the slices to steam or an oxidizing atmosphere at about 1000° C., for >10 hours. This causes a thick field oxide layer 26 to be grown as seen in FIG. 4b, extending into the silicon surface as silicon is consumed, with the remaining part of the nitride layer 32 masking oxidation. The thickness of this layer 26 is about 10,000 Å, part of which is above the original surface and part below. The boron doped P+ regions 33 formed by implant are partly consumed, but also diffuse further into the silicon ahead of the oxidation front to produce P+ field stop regions 27 which are much deeper than the original regions 33.

Next the remaining nitride layer 32 is removed by an etchant which attacks nitride but not silicon oxide, then the oxide 31 is removed by etching and the exposed silicon cleaned. The oxide layer 22, 23 is grown by thermal oxidation to a thickness of about 400 Å.

As seen in FIG. 4c a layer of polycrystalline silicon is deposited over the entire slice in a reactor using standard techniques to a thickness of about 8000 Å. This polysilicon layer is patterned by applying a layer of photoresist, exposing to ultraviolet light through a mask prepared for this purpose, developing, then etching the exposed polysilicon to define the gates 12 and 18, and connecting segments 12' and 18'. An arsenic implant or a phosphorus diffusion is now performed to create the N+ bit lines 17, source regions 13 and drain regions 14, using the polysilicon 12, 18 as a mask.

A thin thermal oxide coating is grown, then a thick layer 25 of silicon oxide is deposited over the entire slice by decomposition of silane at a low temperature, about 400° C. This layer 25 insulates the metal layer from the layer of polycrystalline silicon and other areas of the face of the bar, and is referred to as multilevel oxide.

Referring to FIG. 3a the multilevel oxide layer 25 (and underlying thin thermal oxide) is now patterned by a photoresist operation which exposes holes for what will be the metal-to-poly contacts 16 and 19 along the word lines 15 and bias lines 20 in the cell array. The metal word lines 15 and bias lines 20 are formed next. Metal contacts and interconnections are also used in a periphery of the chip in the input buffers, decoders, sense amplifiers, and the like, as well as for the bonding pads which provide connection to external electrodes. The metal lines 15, 20 are made in the usual manner by depositing a thin film of aluminum over the entire top surface of the slice, then patterning it by a photoresist mask and etch sequence, leaving the metal strips 15, lines 20, and other metal elements. A protective overcoat (not shown) is then deposited and patterned to expose the bonding pads, and the slice is scribed and broken into individual bars which are packaged in the customary manner.

It is important to note that, in contrast to prior cells, the polysilicon capacitor gates 18 are not parts of a continuous strip but instead are separate segments connected to metal lines 20 running parallel with the word lines 15. A segment is shared by two adjacent cells. Also, one contact 16 to the transistor gates is shared by two adjacent cells. The alignment of the mask which creates the gates of the access transistors 10 is not critical. The gates may move to the left in FIGS. 1 and 3e to the edge of the bit line 17 with no affect on transistor characteristics, or likewise move to the right with no significance other than a small change in the size of the capacitor 11.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. A method of making an array of rows and columns of dynamic semiconductor memory cells of the one-transistor type, each cell having an access transistor and a capacitor, comprising the steps of:
    applying a layer of conductive material on a face of a body of semiconductor material, the layer forming a transistor gate for each said access transistor and a capacitor gate for each said capacitor overlying and separated from a capacitor area and a transistor area for each cell by thin insulator,
    forming heavily doped regions in said face adjacent said transistor and capacitor areas to provide a source-to-drain path for each access transistor and a connection to the capacitor area for each cell,
    applying an insulator coating on said face over said layer of conductive material,
    opening a pair of separate openings in said insulator coating for each adjacent row or cells for said transistor gate and said capacitor gate, and
    applying a conductive coating on said face over said insulator coating and extending into said openings, and patterning said conductive coating to define first and second parallel strips to form separate connections to the capacitor gate and the transistor gate, the strips being shared by said adjacent rows of cells, the second strips including means extending along said face to contact the transistor gates in said openings.

2. A method according to claim 1 wherein said semiconductor body is P-type silicon, said heavily doped regions are N+, and said conductive coating is polycrystalline silicon.

3. A method according to claim 2 wherein said polycrystalline silicon layer is patterned to define a capacitor gate which will partially underlie the first and second conductive strips.

4. A method according to claim 3 wherein said conductive coating is metal and said insulator coating separates said metal from said face except at said openings.

5. A method according to claim 4 wherein a coating of thick thermal field oxide is formed on said face before applying said layer of conductive material, except in the capacitor and transistor areas and what will be the heavily doped regions, and wherein said openings are over said field oxide.

6. A method according to claim 5 wherein an array of rows and columns of said cells is formed at said face, and the metal includes a plurality of parallel strips of metal, the first strips connecting to the transistor gates for a plurality of cells in a row and the second strips connecting to the capacitor gates for a plurality of cells in a row.

7. A method according to claim 1 wherein said heavily doped regions form column lines running along the face perpendicular to the metal strips.

8. A method of making a semiconductor device comprising the steps of:
applying a layer of conductive material over a face of a semiconductor body to form first and second electrodes overlying first and second semiconductor regions, respectively,
forming doped regions in said face in third and fourth regions adjacent said first and second regions, respectively,
applying an insulator on said face over said layer,
opening first and second holes in said insulator for connecting to said first and second electrodes, respectively, over areas generally spaced from said first and second semiconductor regions, respectively, and
applying a conductive coating to said face and patterning said conductive coating to create separate first and second conductive strips extending into said first and second openings, respectively.

9. A method according to claim 8 wherein the conductive material is polycrystalline silicon and a thin insulator separates said layer from the face at said first and second regions.

10. A method according to claim 9 wherein said first and second conductive strips are metal and the step of applying includes patterning the metal to define elongated metallic strips forming connections to transistor gates at said first holes.

11. A method according to claim 10 wherein the step of patterning the metal includes leaving a plurality of elongated strips to apply capacitor bias voltage for an array of rows and columns of such devices.

* * * * *